United States Patent [19]

Inoue

[11] Patent Number: 4,511,595
[45] Date of Patent: Apr. 16, 1985

[54] LASER-ACTIVATED CHEMICAL-DEPOSITING METHOD AND APPARATUS

[75] Inventor: Kiyoshi Inoue, Tokyo, Japan

[73] Assignee: Inoue-Japax Research Incorporated, Yokohama, Japan

[21] Appl. No.: 616,793

[22] Filed: Jun. 1, 1984

Related U.S. Application Data

[63] Continuation of Ser. No. 433,832, Oct. 12, 1982, abandoned.

[30] Foreign Application Priority Data

Oct. 12, 1981 [JP] Japan .................................. 56-160893

[51] Int. Cl.³ ........................... B05B 5/00; B05D 3/06
[52] U.S. Cl. ................................... 427/43.1; 118/641;
427/53.1; 427/437
[58] Field of Search .............. 118/641; 427/43.1, 53.1, 427/437

[56] References Cited

U.S. PATENT DOCUMENTS 4,217,183  8/1980  Melcher et al. ...................... 204/15
4,239,789 12/1980  Blum et al. .......................... 427/53.1
4,281,030  7/1981  Silfuast ................................. 427/42

FOREIGN PATENT DOCUMENTS

WO80/00013  6/1981  PCT Int'l Appl. .

OTHER PUBLICATIONS

Gutfeld, R. J. von et al., *Laser-Enhanced Plating and Etching Mechanisms and Applications*, IBM, J. Res. Develop., vol. 26, No. 2, Mar., 1982.

*Primary Examiner*—Michael R. Lusignan
*Attorney, Agent, or Firm*—Karl F. Ross; Herbert Dubno

[57] ABSTRACT

A method of and apparatus for chemically depositing a metal to a substrate in the presence of a rapidly flowing chemical-depositing solution furnishing the metal. A narrow light beam is directed onto the substrate and intercepted by a localized area thereon to activate an interface between the area and the flowing solution. The metal in the solution is thereby chemically deposited on the localized area. The beam and the substrate are relatively displaced to successively shift the area of interception of the beam until a desired surface region on the substrate is rapidly deposited. Preferably, the thickness of the solution passing rapidly and traversed by the beam incident on the localized area is limited not to exceed a preselected dimension. The apparatus preferably comprises a mirror for reflecting the beam from a source thereof which is fixed in position onto the workpiece and a drive unit for translationally displacing the mirror to achieve the required displacement of the incident beam relative to the substrate. A lens is disposed in the optical path for the beam and the position thereof is controlled to maintain its focal plane to be coincident with the beam-intercepting localized area.

40 Claims, 12 Drawing Figures

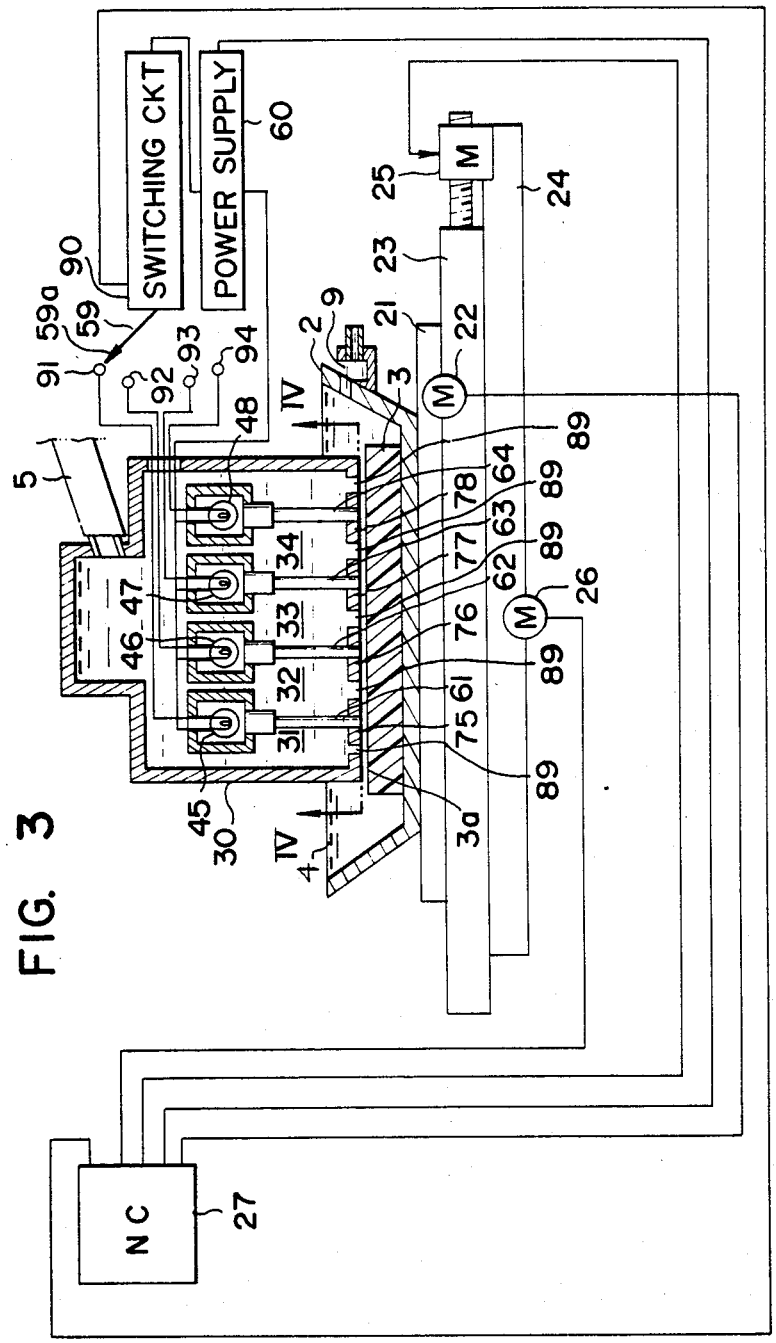

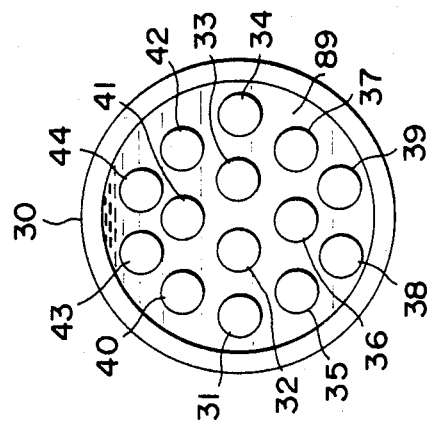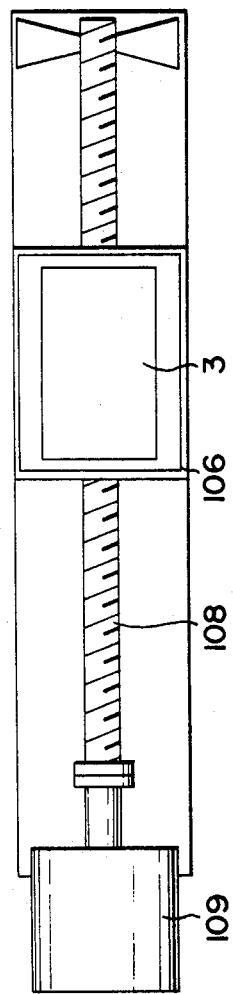

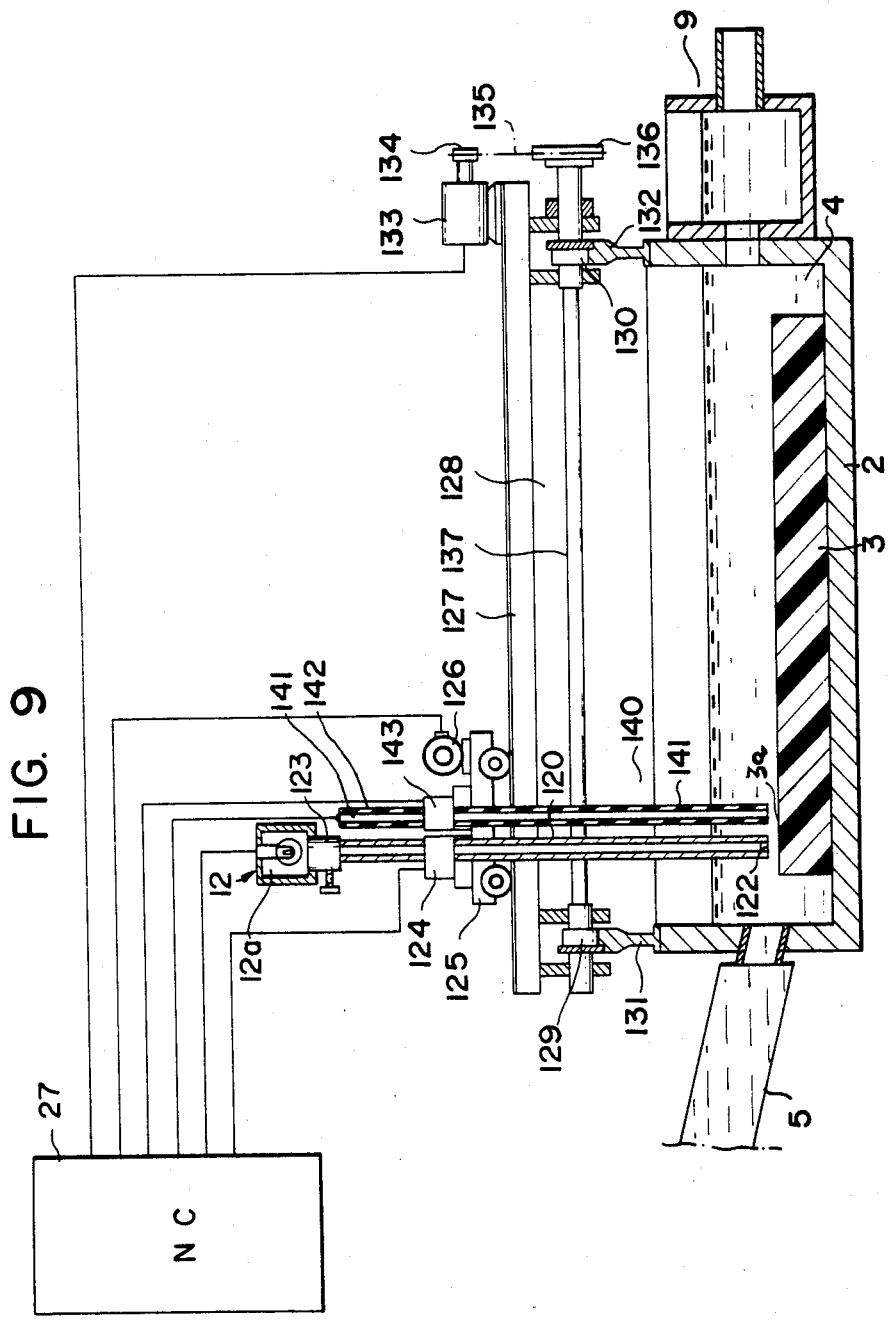

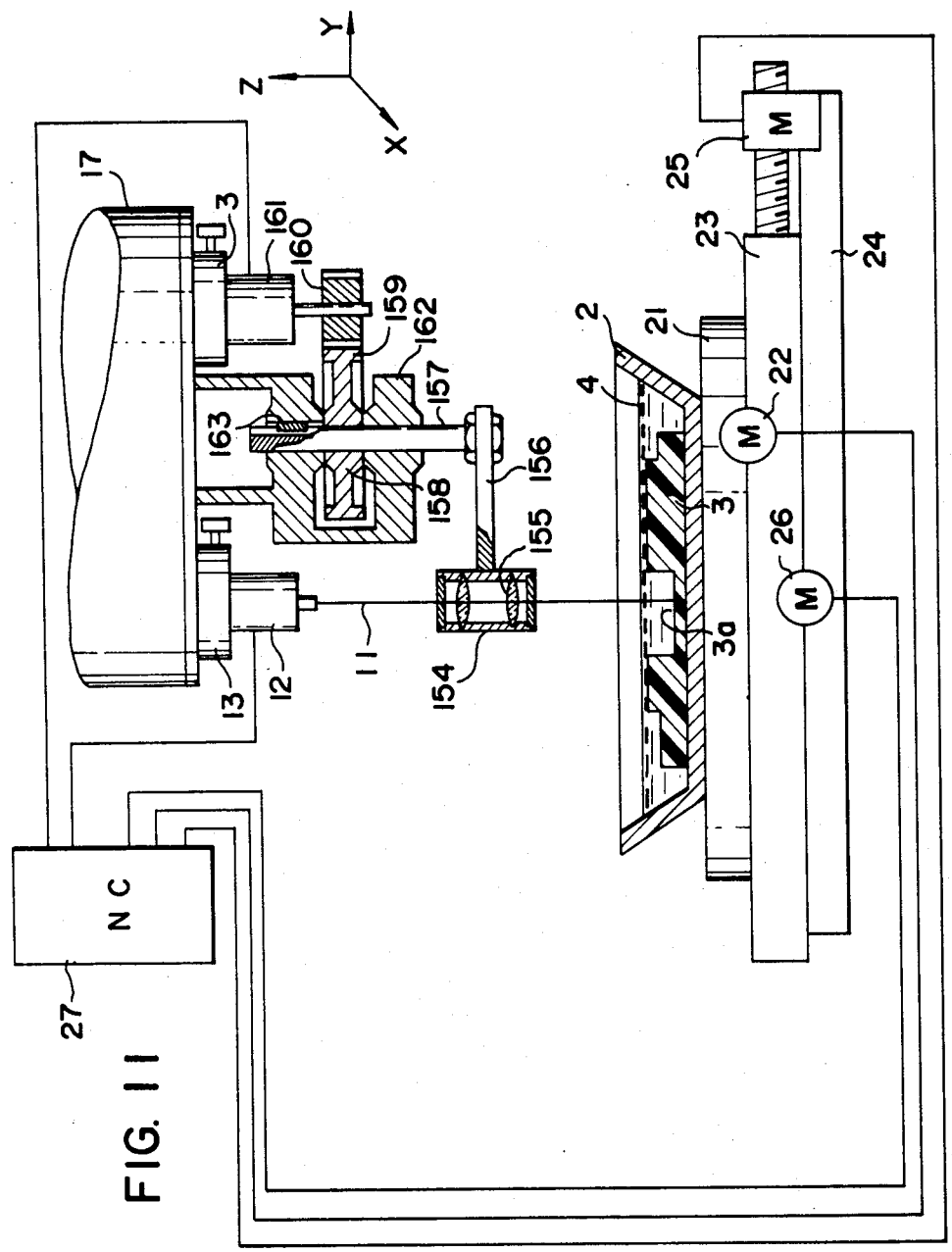

LASER-ACTIVATED CHEMICAL-DEPOSITING METHOD AND APPARATUS

This application is a continuation of application Ser. No. 433,832 filed Oct. 12, 1982, abandoned.

FIELD OF THE INVENTION

The present invention relates to chemical deposition, also called electroless deposition, and more particularly to a new and improved chemical or electroless deposition method and apparatus whereby a local depositability of the surfaces is controlled or enhanced. The invention is particularly advantageous in forming, among others, an intricate pattern of deposit upon a surface without masking or a uniform layer of deposit upon a substrate regardless of the complexity of the contour thereof.

BACKGROUND OF THE INVENTION

Chemical deposition has been known to be a slow deposition process. Moreover, the process has been recognized to be generally inefficient. For example, when a pattern of metal deposit is to be chemically formed on a substrate as practiced in the manufacture of electronic circuit devices, masking has been commonly required and is quite often highly intricate. Not only does the conventional masking procedure make the total process inefficient and costly, it imposes serious restriction on the size of the pattern which can be batch-deposited.

With the chemical deposition process, difficulties have also been encountered in assuring uniformity of a layer of deposit, especially where the receiving substrate is shaped with an intricate contour having ridges or edges and recesses. Generally, the deposit tends to build up predominantly on relatively projecting areas and may occur hardly at all at a recessed corner portion, resulting in an irregularity of deposition over the entire surface and this tendency is generally accentuated as the process continues. While various techniques have been proposed to reduce the deposit irregularity, none of them has been found to be satisfactory on account of efficiency and economy.

In general, there is a consistent desire in the art of chemical or electroless deposition to increase the rate of deposition, to enhance the efficiency of the process and to develop a high-precision layer of deposit which is uniform or controllable in thickness.

OBJECTS OF THE INVENTION

The present invention seeks to provide a novel and improved chemical or electroless deposition method which affords an increased rate of deposition over the prior art and which also allows any desired pattern of metal deposit or a desired uniform layer of metal deposit to be achieved readily and with due precision.

The present invention also seeks to provide a novel and improved chemical or electroless deposition apparatus whereby a desired pattern or layer of metal deposit is obtainable with due precision and yet with greater efficiency than with the prior art.

SUMMARY OF THE INVENTION

In accordance with the present invention there is provided in a first aspect thereof a method of chemically depositing a metal on a substrate, which comprises: bringing a solution containing the metal into contact with the substrate; irradiating a localized area on the substrate with a light beam, thereby activating an interface between the area and the solution to allow the metal to be chemically deposited therefrom selectively on that area; and relatively displacing the light beam and the substrate to shift the localized area of interception of the incident light beam successively over a desired surface region of the substrate whereby the metal is sequentially deposited on the surface region.

Preferably, the chemical-depositing solution should be forced to flow at a high velocity, viz. in excess of 5 meters/sec and less than 100 meters/sec, preferably not greater than 25 meters/sec, in the region of the localized area.

Specifically, the light beam is advantageously a laser beam but may be a narrow beam of intense light in any other form such as from a xenon lamp. It has been found to be desirable to maintain the thickness of the solution traversed by the laser or light beam incident upon the localized area to be not greater than 5 cm and preferably not to exceed 1 cm. With an ordinary chemical depositing solution, such thickness limitation is generally satisfactory with the laser beam being derived from an argon gas laser but is desirably limited further not to exceed 5 mm or 1 mm when the laser is a carbon dioxide gas laser.

It has also been found to be desirable that the chemical-depositing solution contain one or more light-sensitizing substances for the purposes of the present invention. Such substances include CdS, ZnO, $TiO_2$, $SnO_2$, Se, SbGa, chlorophyll and other known organic or inorganic sensitizing agents.

The narrow light beam is emitted from a source thereof which may be fixed in position, the beam in its optical path being reflected by a mirror so as to be incident upon the localized area. The displacement of the mirror is advantageously used to effect at least a portion of the required relative displacement between the beam and the workpiece.

According to a further feature of the invention, the light beam in its optical path is passed through a lens and the lens is positioned to have its focal plane for the beam coincident with the localized area.

The invention also provides, in a second aspect thereof, an apparatus for chemically depositing a metal onto a substrate, which apparatus comprises: means (a) for bringing a solution containing the metal into contact with the substrate; means (b) for irradiating a localized area on the substrate with a light beam, thereby activating the interface between the area and the solution to allow the metal to be chemically deposited therefrom selectively onto that area; and means (c) for relatively displacing the light beam and the substrate to shift the localized area of interception of the beam successively over a desired surface region on the substrate whereby the metal is sequentially deposited on the surface region.

Preferably, pumping means is provided for passing the chemical-depositing solution at a high velocity in the region of the workpiece surface.

Specifically, the means (b) advantageously includes a laser constituting a source of the light beam.

The means (b) may also advantageously include a source of the narrow light beam together with mirror means for reflecting the beam from the source onto the substrate. The means (c) then includes means (c') for displacing the mirror means. The source may be fixed in position. The means (b) may also advantageously include lens means disposed in the optical path between the source and the substrate for establishing a focal plane for the beam from the source. The apparatus may then further comprise means (d) for displacing the lens means so as to maintain the focal plane coincident with the localized area as the beam and the substrate are relatively displaced by means (c).

In accordance with a further feature of the apparatus aspect of the invention, the means (b) comprises an assembly including a source of the light beam and a hollow optical guide means having its one open end connected to a source of the beam and its other open end adapted to be closely spaced from the localized area for projecting the beam transmitted from the source onto the localized area on the substrate. The said other open end of the hollow guide means is advantageously fitted with a transparent or semi-transparent solid member for preventing entry therein of the depositing solution in the region of the substrate. The solid member is preferably shaped so as to serve as a lens for the beam to be passed therethrough onto the localized area on the substrate from the source. Alternatively, means may be used for filling the hollow space in the guide means with a pressurized gas to prevent entry thereto of the depositing solution in the region of the substrate.

BRIEF DESCRIPTION OF THE DRAWING

These and other features of the present invention as well as advantages thereof will become more readily aparent from a reading of the following description of certain exemplary embodiments thereof when taken with reference to the accompanying drawing in which:

FIG. 3 is a similar view illustrating an arrangement of the invention in which a plurality of beam irradiation units are accommodated in a solution delivery chamber;

FIG. 4 is a generally cross-sectional view of such a plural unit assembly chamber;

FIG. 6 is a generally top plan view of a portion of the apparatus shown in FIG. 5;

FIG. 9 is a diagrammatic and partly sectional view illustrating the apparatus of FIG. 7 including means for measuring the thickness of a layer of chemical deposit according to the invention;

FIG. 10 is a similar view illustrating the apparatus of FIG. 7 including an additional measure according to the invention an;

FIG. 11 is a similar view illustrating another form of the arrangement for carrying out the method of the invention.

SPECIFIC DESCRIPTION

Figure 1:
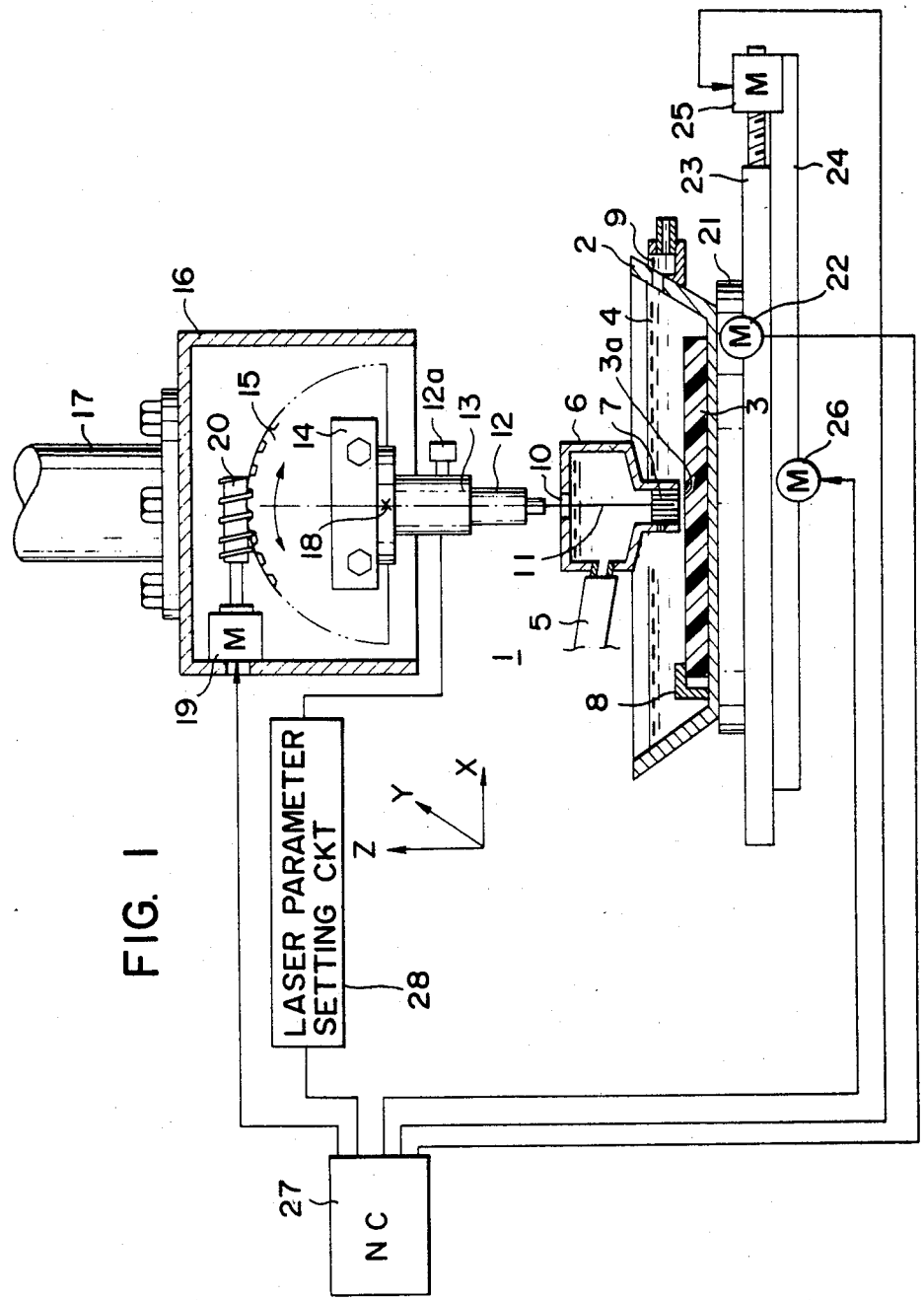
FIG. 1 is a diagrammatic view, partly in section, illustrating an apparatus according to the present invention.

Referring now to FIG. 1 there is shown a chemical- or electroless-depositing apparatus 1 embodying the present invention. The apparatus 1 includes a worktank 2 which accommodates a workpiece or substrate 3 which is shown immersed in a chemical-depositing solution 4 which contains a metal to be deposited upon the substrate 3. The solution 4 is supplied by a pump (not shown) from a source thereof (not shown) through an inlet pipe 5 into a delivery chamber 6 for temporary storage therein and thence onto a surface of the workpiece 3 through an opening 7 formed at the lower end of the delivery chamber 6. It is desirable that the solution 4 be passed at a high velocity, e.g. between 5 and 25 meters/sec, in the region of the surface of the workpiece 3. The workpiece 3 is secured in position by a clamp 8 within the worktank 2. The worktank 2 is provided at an upper end portion thereof with a drain outlet 9 to accept the overflowing solution and to feed it to a suitable treatment vessel (not shown).

The solution delivery chamber 6 is formed with an opening or passage 10 through which a laser beam 11 from a laser beam source or gun 12 is passed to irradiate a localized area on the surface 3a of the workpiece 3. The laser gun 12 has a focusing knob 12a for the beam 11 and is carried by a holder 13 which is in turn secured to a support member 14 attached to a semi-circular disk 15. The latter is a semi-circular worm wheel rotatably mounted to a head 16 which depends from a spindle 17. The worm wheel 15 is rotatable about an axis 18, i.e. a Y-axis, to swing the laser gun 12 and hence the laser beam 11 in an X-Z plane orthogonal to the Y-axis 18. The angle of swing is established by the operation of a motor 19 which is drivingly coupled with a worm 20 in mesh with the worm wheel 15. It should be noted that the gun holder 13 or the support member 14 therefor and the solution delivery chamber 6 are mechanically coupled with each other.

The worktank 2 is securely mounted on a rotary table 21 which is driven by a motor 22 to angularly displace the workpiece 3 in a predetermined polar coordinate system in the X-Y plane. The rotary table 21 is in turn carried on X-axis and Y-axis tables 23 and 24 in a cross-slide arrangement to rectilinearly displace the workpiece 3 in the X-Y plane coordinate system. The tables 23 and 24 are driven by motors 25 and 26, respectively. A control unit 27 is provided to furnish the motors 19, 22, 25 and 26 with respective drive signals based upon preprogrammed data to displace the workpiece 3 so that the laser beam 11 sweeps in a scanning manner with the four degrees of freedom along a predetermined path on the surface thereof. The control unit 27 is also stored with velocity commands for the displacement. Furthermore, the beam gun 12 has a parameter setting circuit 28 sequence-controlled by the control unit 27 to sequentially alter the diameter and/or the energy of the irradiating laser beam 11 in accordance with a predetermined program.

In operation, the delivery chamber 6 is furnished with a chemical-depositing solution, e.g. nickel or copper plating solution to deliver it to the surface of the workpiece 3 at a high velocity as previously indicated. Chemical-depositing conditions, including the temperature of the solution, are set up such that without irradiation with a laser beam, deposition takes place uniformly over the workpiece surface 3a and slowly as usual or at a rate much slower than a customarily attainable optimum or highest deposition rate, or even such that practically no deposition continues without irradiation with a laser beam.

Figure 2:
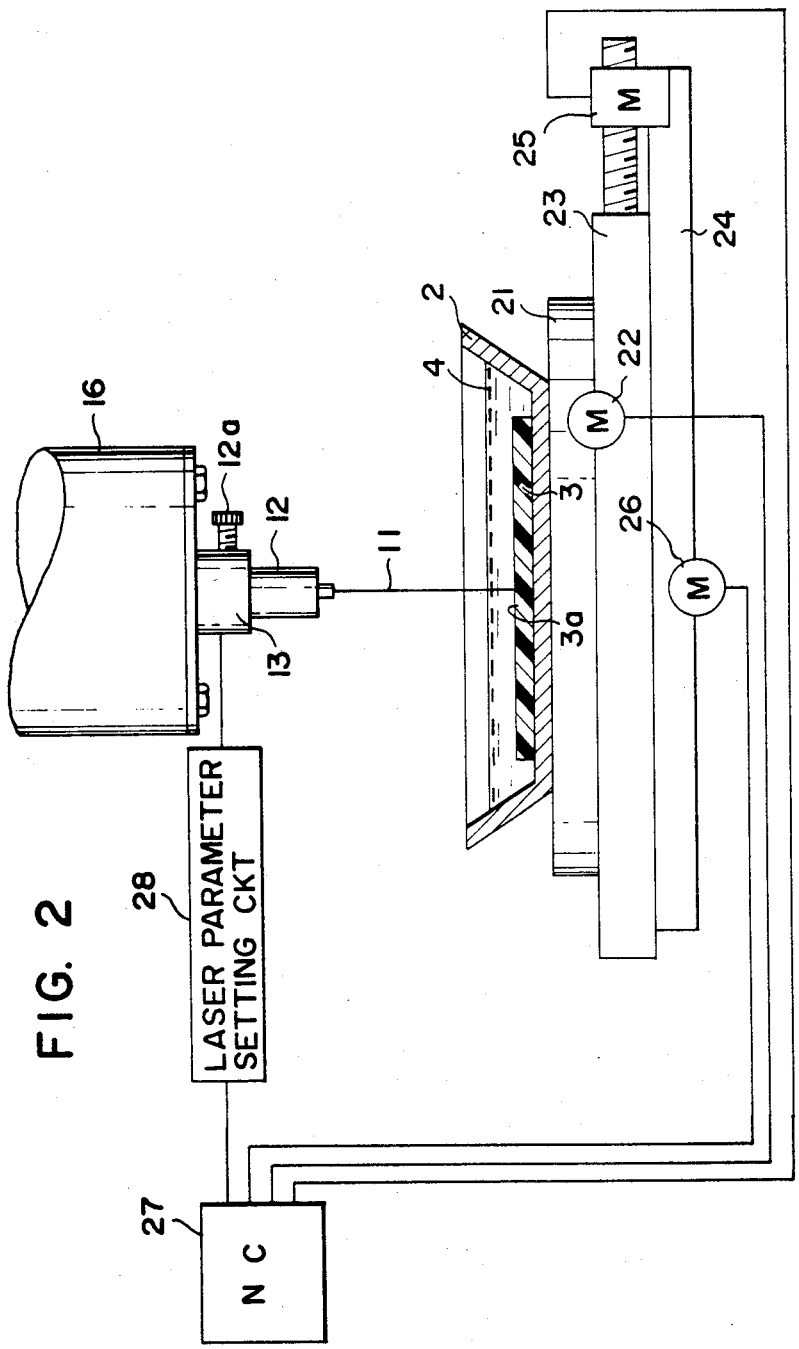
FIG. 2 is a similar view illustrating a simplification of the apparatus of FIG. 1.

FIG. 2 shows an arrangement which is essentially the same as that shown in FIG. 1 except that the solution delivery chamber 6 is dispensed with and the workpiece 3 is immersed in an essentially static mass of the solution 4 retained in the worktank 2. The solution may be caused to flow slowly between an inlet and an outlet which are formed in the worktank 2 but not shown.

It has been found that the laser beam 11 acts as a narrow thermal beam to heat the depositing solution up to a temperature from 45° to 60° C. or higher in the region of a localized area on the workpiece surface 3a through which the solution 4 is forced to flow and that it impinges and thereby selectively activates that interface to enhance the chemical-depositability thereof. The focusing knob 12a for the laser beam 11 provided on the gun holder 13 may be used to control the size of the localized activation or depositability-enhanced area on the workpiece surface 3a. By relatively displacing the laser beam 11 and the workpiece 3, it follows that chemical deposition develops on the workpiece surface 3a selectively along the path of displacement of the laser beam 11 relative to the workpiece 3. Thus, a pattern of deposition defined by the size of the beam 11 and the path of the relative displacement is created on the workpiece surface 3a. The rate of the relative displacement is determined according to the thickness of a deposition pattern desired. Not only is it possible in this manner to achieve a continuous deposition pattern of any shape desired but a set of discontinuous or discrete such patterns is obtainable. To the latter end, the control unit 27 operates to turn off the laser source 12 during programmed time intervals in the course of the scanning operation selectively to leave intact those areas which are within the path of the relative displacement but not to be chemically deposited. Thus, the laser gun 12 may be deactuated selectively during those time intervals or for the corresponding sections of the relative displacement. It is, of course, desirable that minimum time intervals be employed to traverse these sections.

It will be apparent that the method of the invention is useful for producing a print-form circuit or wiring on a board for electronic devices. The method is also advantageously used for metal plating or forming on a substrate which is of an intricate contour or has one or more recesses or grooves which could be chemically plated only with difficulty by the conventional technique. Accordingly, thanks to the invention, a metal deposit is achieved uniformly over such a substrate by controlling the time of irradiation or the rate of scan with the laser beam 11 or the local point thereof according to the position on the workpiece surface or substrate 3a. Generally, a recessed area or corner portion in a recess may be irradiated for a longer time than other areas.

Referring to FIG. 3 in which the same reference numerals as those in FIGS. 1 and 2 are used to designate the same or functionally same parts, a modified apparatus embodying the present invention is illustrated. The apparatus 2 makes use of a relatively large solution delivery chamber 30 in which a plurality of laser irradiation units 31-44 (FIG. 4) are accommodated. Each of these units, of which only 31-34 appear in FIG. 3, comprises a laser source 45, 46, 47, 48, . . . connected via a rotary switch 59 to an energization power supply 60 and an optical guide 61, 62, 63, 64, . . . connected at its upper end to the laser source and having its lower end juxtaposed with the workpiece surface 3a and fitted with a disk 75, 76, 77, 78, . . . . These disks are positioned to be flush with one another, defining the lower end surface of the delivery chamber 30 and are spaced apart from one another with a spacing 89 serving as a solution delivery passage. Here again, the solution 4 is forced to pass in the region of the workpiece 3a at a high velocity as indicated.

The rotary switch 59 comprises a rotary arm 59a actuated by a switching circuit 90 and arranged for engagement with fixed contacts 91, 92, 93, 94, . . . , which are connected to the laser sources 45, 46, 47, 48, . . . , respectively. The switching circuit 90 is operated by the control unit 27 in accordance with a predetermined program stored therein to selectively energize the laser sources 45, 46, 47, 48, . . . from the power supply 60. The control unit 27 also acts on the power supply 60 to control the intensity of the laser beam emitted from each of the sources 45, 46, 47, 48, . . . in accordance with a predetermined stored program. In each of the units 31, 32, 33, 34, . . . the laser beam emitted from the source 45, 46, 47, 48, . . . passes through the optical guide 61, 62, 63, 64, . . . to irradiate a localized area on the workpiece surfaces 3a in the presence of a high-velocity stream of the depositing solution supplied from the inlet conduit 5 through the delivery chamber 30 and the outlet passage 89 thereof. The localized areas on the surface 3a of the workpiece 3 are thereby activated and selectively chemically deposited.

Figure 5:
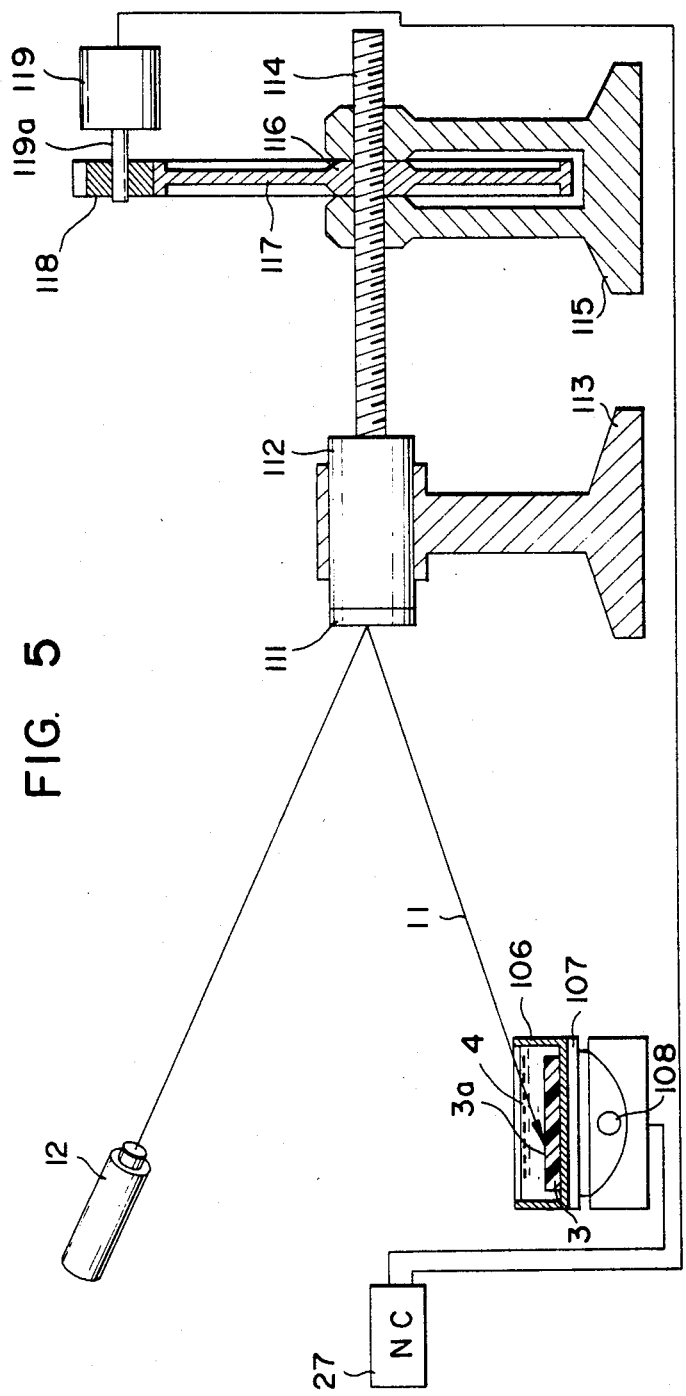
FIG. 5 is a diagrammatic view, partly in section and partly in perspective, illustrating another apparatus for practicing the method of the invention.

In the further embodiment shown in FIGS. 5 and 6 the laser beam 11 emitted from a laser gun 12, upon reflection by a mirror 111, impinges on a workpiece 3 immersed in chemical-depositing solution 4 in a worktank 106 through which it is forced to flow at a high velocity as indicated. The latter is securely mounted on a slide table 107 with which is drivingly coupled a feed screw 108 extending in the direction normal to the sheet of the drawing to position the workpiece 3 in that direction along a predetermined coordinate axis, i.e. a Y-axis. The feed screw 108 is driven by a motor 109 (FIG. 6) which operates in response to drive signals furnished from a control unit 27, e.g. a numerical controller.

The mirror 111, having its mirror face vertical, is carried on a horizontal support member 112 which is supported on a pedestal 113 so as to be movable horizontally along a predetermined coordinate axis, i.e. an X-axis. The support member 112 is carried by a lead screw 114 which is slidably supported on a pedestal 115. The lead screw 114 is in mesh with a nut 116 fitted in the center of a large gear 117 in mesh with a small gear 118. The latter is carried on the drive shaft 119a of a motor 119 which operates in response to drive signals furnished from the control unit 27. As the motor 119 is driven, the lead screw 114 is rotated to displace the support member 112 and hence the mirror 111 in the direction of the X-axis to displace the position of the laser beam 11 reflected thereby and impinging on the workpiece surface 3a.

The control unit 27 has path data for relative displacement of the reflected laser beam 11 and the workpiece 3 preprogrammed therein and operates to produce from those data drive signals for the operation of the X-axis motor 119 and the Y-axis motor 109.

The solution may, of course, be any conventional chemical depositing solution. For example, copper sulfate solution may be used for copper deposition. For nickel deposition, sulfonic nickel solution may be used. The laser should preferably be an argon gas laser (having a wavelength between 4880 and 5145 angstroms, green), which has a high transmissivity to such a solution. A beam of the laser can penetrate a solution as thick as 1 to 5 cm and, without substantial heating thereof, is capable of selectively activating a localized area on the workpiece surface to enhance its depositability. By contrast, a carbon-dioxide gas laser (having a wavelength of 10.6 μm) is relatively low in transmissivity to the solution mentioned and requires that the solution should be present in a thickness as small as 5 mm or less. For example, a laser beam from a carbon-dioxide gas laser of 50 watt output can successfully be used to scan a workpiece at a rate of 30 mm/min in deposition of nickel upon the workpiece from a sulfonic nickel chemical-depositing solution when the thickness of the solution on the workpiece is 0.5 mm. The solution of that thickness through which the beam travels is then heated up to 60° C. When the thickness is increased to 5 mm, the degree of the localization of deposition is largely reduced.

Since the size of a laser beam spot can be reduced down to twice the wavelength of the beam, the method of the invention is advantageously applicable to printing-type deposition wiring of tiny electronic devices and also to high-precision localized deposition. In chemical-deposition of nickel from a sulfonic nickel solution, an argon gas laser can be used to provide a beam spot of 0.2 mm diameter and thereby a localized deposition of the same area. This area is increased to 4 mm when the laser is replaced by a carbon-dioxide gas laser.

Figure 7:
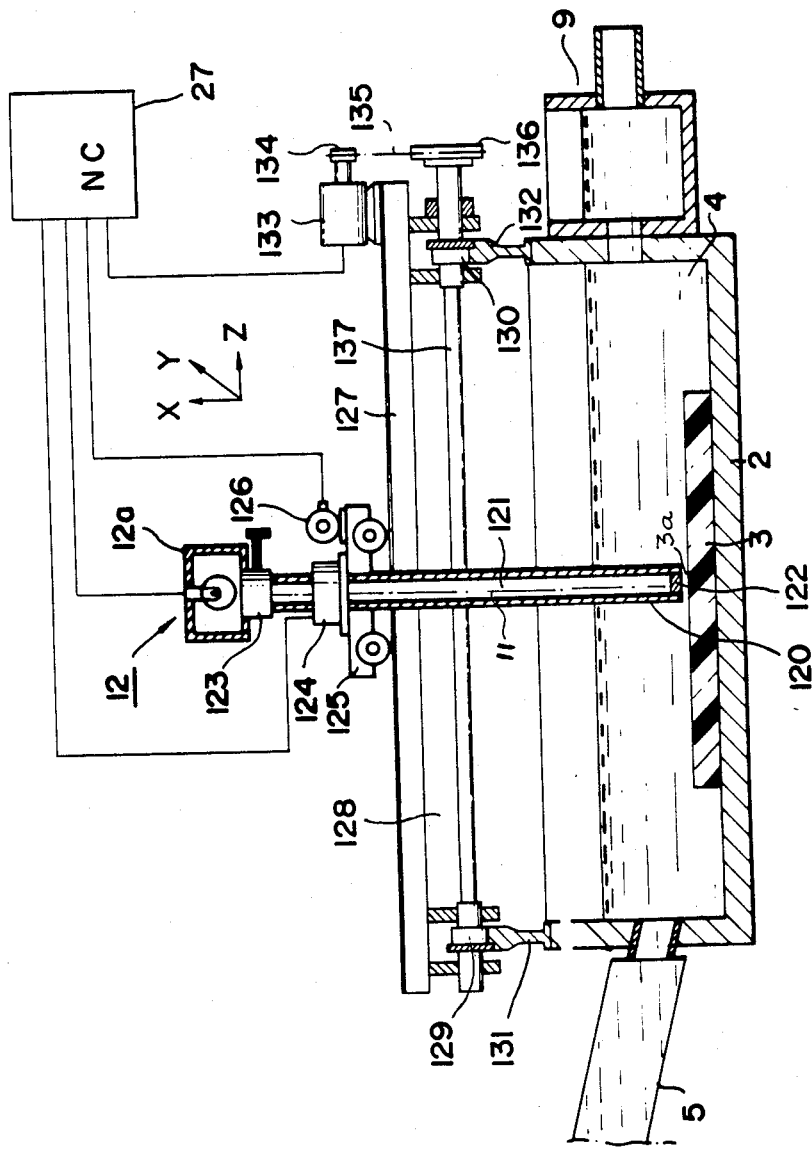
FIG. 7 is a diagrammatic view, partly in section, illustrating a further embodiment of the apparatus according to the invention.
Figure 8A:
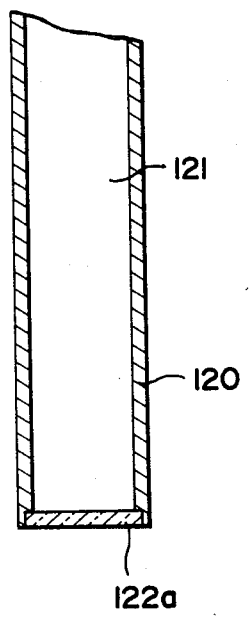
FIGS. 8(A) and 8(B) are longitudinal sectional views of two possible forms of the tubular optical guide member shown in FIG. 7.
Figure 8B:
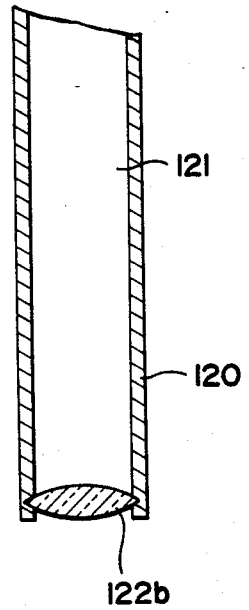

In the embodiment of FIG. 7, an elongate tubular optical guide member 120 is juxtaposed with the surface 3a of a workpiece 3 immersed in the chemical-depositing solution 4 retained in the worktank 2. The solution 4 is introduced into the worktank 2 via an inlet conduit 5 and drawn out through a drain outlet 9. The elongate tubular guide member 120 has at its lower or forward end a transparent or semi-transparent member 122 fitted therein which may be a plain glass plate as shown at 122a in FIG. 8(A) but is preferably shaped, as shown at 122b in FIG. 8(B), to serve as a convex lens for a laser beam 11 emitted from a laser gun 12. The tubular guide member 120 is secured via a coupling ring 123 to the laser gun 12 so that the laser beam emitted from the laser source 12a is passed through the inner bore 121 of the tubular guide member 120 and the transparent or semi-transparent member 122 for irradiation of a localized area on the surface 3a of the workpiece 3. The member 122 is designed also to prevent chemical-depositing solution 4 in the tank 2 from entering into the inner bore 121 of the guide member 120.

The unit structure comprising the laser gun 12, the annular coupling 123 and the tubular optical guide member 120 in combination is carried by a vertical positioner 124 seated on a wheeled carriage 125. The vertical positioner 124 operates in response to drive signals furnished from the control unit 27 to position the forward end of the tubular guide member 120 in closely spaced juxtaposition with the surface 3a of the workpiece 3 which is shown to be planar but may be of an intricate three-dimensional contour.

The wheeled carriage 125 is displaceable by a motor 126 so as to roll over a track 127 in the direction of the X-axis indicated. The track 127 is securely supported on a wheeled carriage 128 with wheels indicated at 129 and 130 and adapted to roll on a pair of rails 131 and 132 to displace the carriage 128 in the direction of the Y-axis indicated. The rails 131 and 132 are mounted to stand vertically on the upper edges of the two opposed walls of the worktank 2, respectively and to extend in parallel with each other. A motor 133 mounted on the track 127 has on its output shaft a pulley 134 which is coupled via a belt 135 with a pulley 136 secured to the rotary shaft 137 carrying the wheels 129 and 130 for the carriage 128. As the motor 133 is driven in response to drive signals furnished from the control unit 27, the carriage 128 is thus driven to position the axis of the tubular electrode in the Y-axis coordinate.

The workpiece 3 may, for example, be a silica board for formation of an electronic circuit thereon. The board 3 has been pre-treated according to the conventional techniques, viz. washing, de-greasing with a 10% sodium hydroxide solution, washing, acid-washing with a 3.5% HCl solution, washing and drying in sequence. The board is then sensitized with a sensitizing agent consisting of 10 gr/l $SnCl_2$ and 20 to 50 gr/l HCl. Thereafter, upon washing, the board is activated at 50° C. with an activating agent composed of 0.5 gr/l $PdCl_2$ which has added thereto HCl to make its pH 3 to 4 to substitute Sn with Pd which constitutes nuclei for chemical deposition with a desired metal. The activated board is then washed and dried.

The subsequent step of actually depositing the desired metal, say, copper upon the pretreated board may also make use of a known chemical-depositing solution which is, for example, composed of 0.1 mol/cm$^3$ of (HCHO)n where n is normally 3, 0.05 mol/cm$^3$ of $CuSO_4$ and 0.15 mol/cm$^3$ of $Na_2EDTA$ salt. As is common, the solution further contains NaOH in an amount to adjust the pH value at 12.5 The solution has a temperature of 5° C. and is introduced through the inlet 5 into the worktank 2 to flow rapidly in the region of the upper surface of the board 3 so that little deposition of the copper metal from the solution is caused thereon. The flowing solution 4 is drained out of the worktank through the outlet 9.

In the state described, the laser 12 is actuated to project a laser beam. The laser 12 may be an argon laser and the beam intensity adjusted at 15 watts. The lens 122b is used to focus the beam so that the beam has a cross section of 15 μm diameter. The laser beam is focused at a localized area on the board surface 3a so that it impinges and thereby selectively activates the interface between the surface 3a and the solution 4 to enhance the chemical-depositability of the localized region. By relatively displacing the laser beam and the board, it follows that chemical deposition develops on the board surface 3a selectively along the path of displacement of the laser beam relative to the board. Thus, a pattern of deposition defined by the size of the laser beam and the path of the relative displacement is created on the board surface 3a. In this manner, it has been found that deposition proceeds at a rate up to 15 times greater than that obtainable by the conventional technique or without the use of a laser beam. The rate of the relative displacement is determined according to the thickness of a deposition pattern desired. Not only is it possible in this manner to achieve a continuous deposition pattern of any shape desired but a set of discontinuous or discrete such patterns is obtainable. To the latter end, the control unit 27 operates to turn off the laser source 12a during programmed time intervals in the course of the scanning operation selectively to leave intact those areas which are within the path of the relative displacement but not to be chemically deposited. Thus, the laser gun 12 may be deactuated selectively during those time intervals or for the corresponding sections of the relative displacement. It is, of course, desirable that minimum time intervals be employed to traverse these sections.

In copper chemical-deposition, it is desirable that the solution of the type described be held at a relatively low temperature, e.g., in a range between 3° C. to 10° C., say, at 5° C. In this case it is desirable that a suitable cooling means be disposed in contact with the workpiece 3, say, at the rear side thereof to hold it cooled at the low temperature. In nickel chemical-deposition, a solution may be held at a relatively high temperature, say, 80° C. In the practice of the invention, the nickel chemical-deposition may be held at room temperature, say, at 20° C. and then no cooling means may be provided.

The arrangement of FIG. 9 is the same as in FIG. 7 except that it includes a further provision for measuring the thickness of a deposited layer on the workpiece surface 3a behind the tubular guide member 120. Thus, there is provided a measuring electrode assembly 140 comprising an electrode 141 coated with an insulating film 142, which assembly extends in parallel with the tubular guide member 120 and is carried by its vertical positioner 143 seated on the wheeled carriage 125. The vertical positioner 143 operates in response to drive signals furnished from the control unit 27 to position the forward end of the measuring electrode 141 in contact or closely spaced juxtaposition with the deposited workpiece surface 3a. Since the single carriage 125 is used to carry both the tubular guide member 120 and the measuring electrode assembly 140, the axis of the latter is held to be adjacent to the axis of the tubular guide member 120.

The measuring electrode 141 is adapted to sense its contact or proximate relationship with the deposited workpiece surface 3a by measuring, for example, the electrical resistance therebetween, and to transmit a sensed signal to the control unit 27. The latter continues to furnish drive signals to cause the vertical positioner 125 to advance the measuring electrode assembly 140 until its preselected contact or proximity relationship with the deposited workpiece surface 3a is attained. The distance of advance required may be registered in the control unit 27 to produce control signals which act on the laser gun 12 to control the intensity of the light emitted from the laser source 12a.

Figure 10:
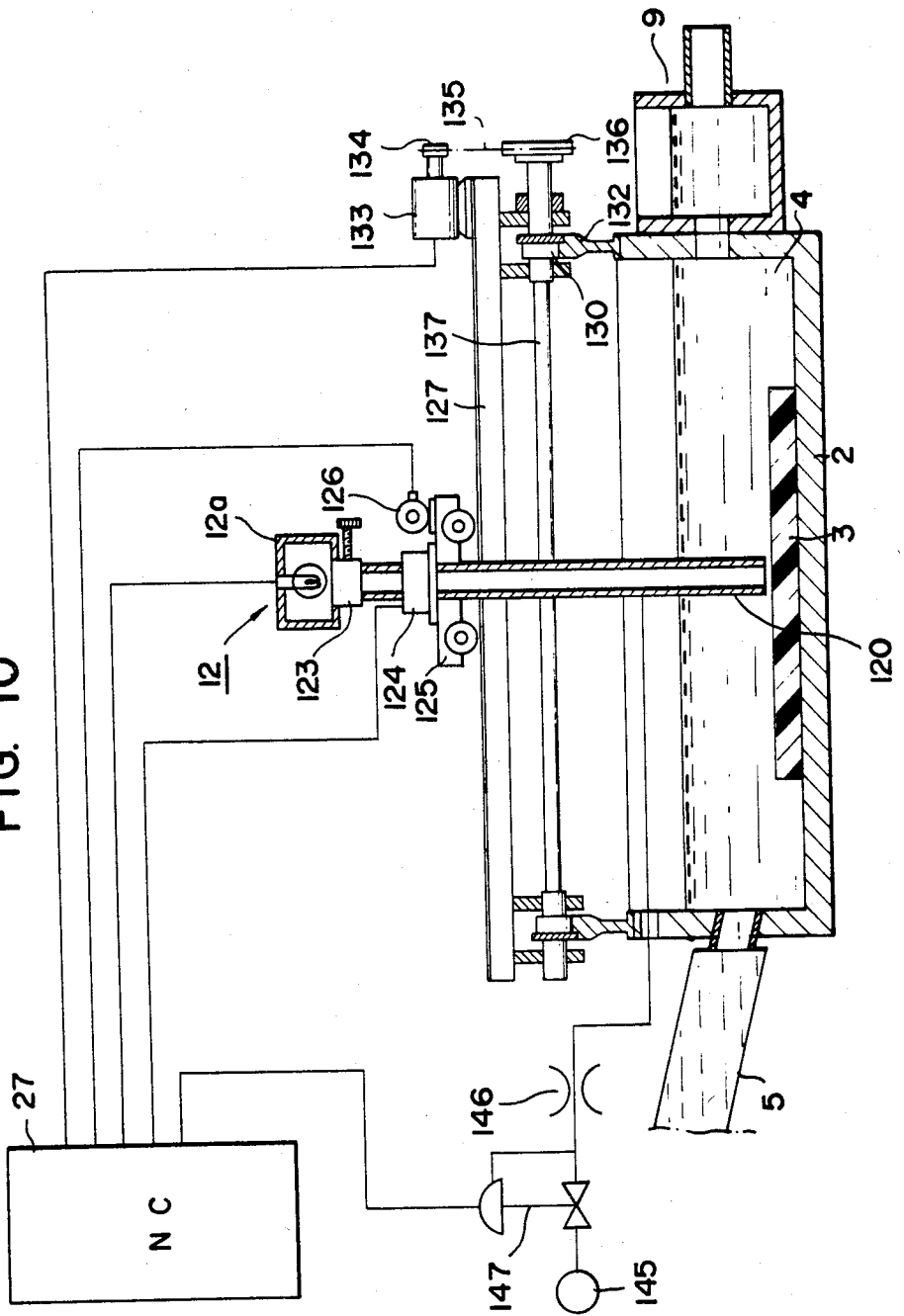

FIG. 10 shows a modification of the embodiment of FIG. 7 and again uses the same reference numerals used therein to indicate the same parts. In ths arrangement of FIG. 10, the inner bore 121 of the tubular guide member 120 communicates with a source of pressure gas 145, such as a compressor, via a throttle valve 146 and a pressure-regulating valve 147. In this manner, the inner bore 121 is filled with the pressurized gas to prevent entry of the depositing solution 4 therein. The pressure-regulating valve 147 operates in response to command signals furnished from the control circuit 27. The control circuit 27 operates to control the pressure-regulating valve 147 so that the pressure of compressed gas within the inner bore 121 of the tubular guide member 120 always exceed the pressure of the solution 4 in the open end region of the tubular guide member 120 to prevent entry of the solution into the bore 121 thereof.

FIG. 11 shows a laser-assisted chemical-depositing apparatus embodying the present invention and again makes use of the same reference numerals as used in the previous FIGURES to designate the same or functionally same parts. In this arrangement, a laser gun 12 securely mounted via its holder 13 to a spindle or ram head 17 is designed to project a vertical laser beam 11 for irradiation of a localized area on the workpiece surface 3a therewith. In the path of the laser beam 11 there is provided a beam-focusing assembly 154 in which a plurality of lenses 155 are arranged. The assembly 154 is supported by a horizontal arm 156 which is in turn supported by a vertical lead screw 157 at its lower end. The lead screw 157 is in mesh with a nut 158 which is geared on its periphery 159 in mesh with a gear 160 secured to the output shaft of a motor 161. By its holder the motor 161 is secured to the spindle 17. The nut 158 is, for its vertical position to be fixed, retained between a pair of bearing surfaces of a support member 162 secured to the spindle 17. Further, the lead screw 157 formed with a key-in groove engaged by a projection 163 on the support member 162 is held against rotation. The motor 161 operates in response to drive signals furnished from the control unit 27, e.g. a numerical controller, to position the lens assembly 154 so that the laser beam 11 projected from the laser gun 12 is focused on the localized area on the workpiece surface 3a.

The arrangement of FIG. 11 is particularly advantageous for chemical-deposition of a workpiece with recessed surfaces or of an intricate contour as shown. The control unit 27 provides the motors 22, 25 and 26 with drive signals to displace the workpiece 3 along a preprogrammed path in the X-Y plane as that its surface 3a is swept over by the laser beam 11 from the laser gun 12. During the planar displacement of the workpiece 3 in the X-Y plane, the motor 161 is responsive to Z-axis positioning signals from the control unit 27 to regulate the position of the lens assembly 154 so as to focus the laser beam 11 onto a localized area.

Here again, the chemical-depositing solution may be a conventional copper chemical-depositing solution held at a relatively low temperature, say, 5° C. In order to enhance the light sensitivity to the beam 1, it has been found to be desirable that the solution contain, for example, $Ru_2(bpy)_3X_2$ (obtained by fixing ruthenium to silicate ester of polyvinyl alcohol) in an amount of $2.8 \times 10^{-6}$ mol/l. In this case, the light-beam source 12 can be served by a xenon lamp. The light beam 11 from the xenon lamp 12 is focused by the lens system 154 into a cross section of $3.5\mu$ diameter as it impinges on the workpiece surface 3a. It has been found that the focused xenon light beam when used with the solution containing such a sensitizing substance yields substantially the same rate of chemical deposition as that obtained with an argon laser beam used with the solution omitting the sensitizing substance. When used with the solution containing the sensitizing substance, the laser beam yields a rate of chemical deposition up to three times as great as that obtainable with the xenon light beam used with the solution containing the sensitizing substance.

What is claimed is:

1. A method of chemically depositing a metal onto a substrate, comprising the steps of:
   flushing in a dynamic flow a liquid solution containing said metal in contact with said substrate;
   irradiating a localized area on said substrate with a narrow energy light beam through said flushing liquid solution while maintaining the thickness thereof traversed by said light beam incident upon the localized area to be less than 5 cm, thereby activating an interface between said area and said flushing liquid solution to allow said metal to be chemically deposited therefrom selectively onto said area; and automatically displacing said light beam and said substrate in a predetermined scanning manner such as to shift said localized area of interception of said incident light beam successively over a desired surface region of said substrate whereby said metal is sequentially deposited on said surface region.

2. The method defined in claim 1 wherein said light beam is a beam of Xenon light.

3. The method defined in claim 1 or claim 2 wherein said liquid solution contains at least one organic or inorganic light-sensitizing substance.

4. The method defined in claim 1 wherein said thickness is limited not to exceed 1 cm.

5. The method defined in claim 4 wherein said beam is an argon gas laser beam.

6. The method defined in claim 1 wherein said thickness is limited not to exceed 5 mm.

7. The method defined in claim 6 wherein said beam is a carbon-dioxide gas laser beam.

8. The method defined in claim 7 wherein said thickness is limited not to exceed 1 mm.

9. A method of chemically depositing a metal onto a substrate by bringing a liquid solution containing said metal into contact with said substrate, the method comprising the steps of:
    directing a narrow thermal energy beam which is emitted from a source thereof fixed in position and is in its optical path reflected by a mirror towards the workpiece to cause the reflected beam to be incident upon a localized area thereon, thereby activating an interface between said area and said liquid solution to allow said metal to be chemically deposited therefrom selectively onto said area; and
    displacing said incident beam relative to said workpiece translationally at least in part by translationally automatically displacing said mirror to shift said localized beam incidence successively in a predetermined scanning manner over a desired surface region on said workpiece whereby said metal is sequentially deposited chemically on said surface region.

10. A method of chemically depositing a metal in a continuous layer of a uniform thickness onto a substrate, comprising the steps of:
    bringing said substrate into contact with a flowing liquid solution containing said metal;
    directing a narrow thermal energy beam towards said substrate from a beam generator through a lens disposed in a path of the beam to be incident on a localized area of the substrate, thereby activating an interface between said area and said flowing liquid solution to allow said metal to be chemically deposited therefrom selectively onto said area;
    automatically displacing said beam generator and said substrate translationally in a predetermined scanning manner such as to shift said localized beam incidence continuously over a desired surface region on the substrate whereby said metal is progressively chemically deposited in the continuous layer onto said surface region; and
    increasing the uniformity of the thickness of said layer of chemical deposition by controlling the position of said lens in said path so as to maintain said incident beam to be always focused on the instantaneous localized area in said surface region against a changing thickness of said solution traversed by said incident beam.

11. The method defined in claim 1 wherein the rate of flow of said flushing liquid solution is not less than 5 meters/second.

12. The method defined in claim 11 wherein said rate of flow is not greater than 25 meters/second.

13. A method of chemically depositing a metal in a continuous layer of a uniform thickness into a workpiece of an intricate contour, comprising the steps of:
    (a) bringing a flowing liquid solution containing said metal in contact with said substrate;
    (b) directing a narrow thermal energy beam towards the surface of the workpiece to cause said beam to be incident upon a localized area thereon, thereby activating an interface between said area and said flowing liquid solution to allow said metal to be chemically deposited therefrom selectively onto said area;
    (c) automatically displacing said incident beam and said workpiece relatively generally translationally in a predetermined scanning manner such as to shift said localized beam incidence continuously over a desired surface region on the workpiece surface whereby said metal is chemically deposited progressively in the continuous layer onto said surface region; and
    (d) increasing the uniformity of the thickness of said layer of chemical deposition by controlling at least one of the parameters: the rate of said relative displacement between the incident beam and the workpiece, the thickness of the moving liquid solution traversed by said beam and the diameter and energy of the incident beam, as a function of the instantaneous position of the workpiece displaced relative to said incident beam.

14. A method of chemically depositing a metal on a workpiece, comprising the steps of:
    bringing a flowing liquid solution containing said metal in contact with said workpiece;
    directing a narrow thermal light beam from a source thereof towards the workpiece through said flowing liquid solution of a varying thickness to cause said beam traversing said flowing solution to be incident upon a localized area of the workpiece, thereby activating an interface between said area and said flowing solution to allow said metal to be chemically deposited therefrom selectively onto said area;
    automatically displacing said source and said workpiece in a predetermined scanning manner to shift said localized beam incidence successively over a desired surface region on the workpiece surface whereby said metal is sequentially deposited chemically onto said surface region; and
    increasing the accuracy of the successive localized chemical deposits of the metal over said region by disposing a lens means in a path of said beam between said source and said flowing solution and controlling the position of said lens means in said path to maintain said incident beam to be always focused on the instantaneous localized area in said surface region against said varying thickness of said flowing solution in said path of the beam.

15. A method of chemically depositing a metal on a workpiece, comprising the steps of:
    bringing a flowing liquid solution containing said metal in contact with said workpiece;
    directing a narrow thermal light beam from a source thereof towards the workpiece through said flowing liquid solution of a varying thickness to cause said beam traversing said flowing solution to be incident upon a localized area of the workpiece, thereby activating an interface between said area and said flowing solution to allow said metal to be chemically deposited therefrom selectively onto said area;

automatically displacing said source and said workpiece in a predetermined scanning manner to shift said localized beam incidence successively over a desired surface region on the workpiece surface whereby said metal is sequentially deposited chemically on said surface region; and increasing the accuracy of the successive localized chemical deposits of the metal over said region by controlling at least one of the parameters: the rate of relative displacement of said source to said workpiece and the energy of said beam at said source, as a function of said varying thickness of said flowing solution in said path of the beam.

16. The method defined in claim 13, claim 9, claim 10, claim 14 or claim 15 wherein said beam is a laser beam.

17. The method defined in claim 16 wherein said laser beam is an argon gas laser beam.

18. The method defined in claim 16 wherein said laser beam is a carbon-dioxide gas laser beam.

19. The method defined in claim 16, further comprising maintaining the thickness of said flowing liquid solution traversed by said laser beam incident upon said localized area to be not greater than 5 cm.

20. The method defined in claim 19 wherein said thickness is maintained not to exceed 1 cm.

21. The method defined in claim 16 wherein the rate of flow of said flowing liquid solution in said surface region is not less than 5 m/sec.

22. The method defined in claim 13, claim 9, claim 10, claim 14 or claim 15 wherein said liquid solution contains at least one organic or inorganic light-sensitizing substance.

23. The method defined in claim 13, claim 9, claim 10, claim 14 or claim 15 wherein said beam is a beam of xenon light.

24. The method defined in claim 23 wherein said liquid solution contains at least one organic or inorganic light-sensitizing substance.

25. An apparatus for chemically depositing a metal onto a substrate from a liquid solution containing the metal in contact with the substrate, the apparatus comprising:
(a) pump means for moving the liquid solution in a dynamic flow in contact with the substrate;
(b) means for irradiating a localized area on said substrate with a narrow energy light beam while maintaining the thickness of said moving liquid solution traversed by the light beam not to exceed 5 cm, thereby activating an interface between said area and said moving liquid solution to allow said metal to be chemically deposited therefrom selectively onto said area; and
(c) drive means for automatically displacing said light beam and said substrate in a predetermined scanning manner such as to shift the localized area of interception of said beam successively over a desired surface region of said substrate whereby metal is sequentially deposited on said surface region.

26. An apparatus for chemically depositing a metal in a continuous layer of a uniform thickness onto a workpiece of an intricate surface contour, comprising:
(a) means for supplying a liquid solution containing the metal in a flow in contact with the workpiece;
(b) means for directing a narrow thermal energy beam, traversing the moving liquid solution, onto the surface of the workpiece to cause said beam to be incident upon a localized area thereon, thereby activating an interface between said area and said moving solution to allow said metal to be chemically deposited selectively onto said area;
(c) drive means for automatically displacing said incident beam and said workpiece relatively generally translationally in a predetermined scanning manner such as to shift said localized beam incidence continuously over a desired surface region on said workpiece surface whereby said metal is chemically deposited in the continuous layer on said surface region; and
(d) deposition control means for controlling at least one of the parameters: the rate of said relative displacement between the incident beam and the workpiece, the thickness of the moving solution traversed by said beam and the diameter and energy of the incident beam, as a function of the instantaneous position of the workpiece displaced relative to said incident beam.

27. An apparatus for chemically depositing a metal onto a workpiece, comprising:
(a) means for bringing a liquid solution containing the metal in contact with the workpiece;
(b) a beam generating means for emitting a narrow thermal energy beam;
(c) a mirror means for reflecting said beam from the generating means to cause it to be incident upon a localized area on the workpiece, thereby activating an interface between said area and said solution to allow said metal to be chemically deposited therefrom selectively onto said area, said generating means being fixed in position relative to said workpiece; and
(d) drive means for automatically translationally displacing said mirror means to translationally shift said localized beam incidence successively in a predetermined scanning manner over a desired surface region of said workpiece whereby said metal is sequentially deposited on said surface region.

28. An apparatus for chemically depositing a metal in a continuous layer of a uniform thickness onto a workpiece of an intricate surface contour, comprising:
(a) means for bringing a flowing liquid solution containing the metal in contact with the workpiece;
(b) beam generating means for emitting a narrow thermal energy beam;
(c) lens means disposed in an optical path of the beam from the generating means to cause the beam to be incident on a localized area of the workpiece, thereby activating an interface between said area and said flowing solution to allow the metal to be chemically deposited therefrom selectively onto said area;
(d) drive means for automatically displacing said incident beam and said workpiece generally translationally in a predetermined scanning manner such as to shift said localized beam incidence continuously over a desired surface region on the workpiece surface whereby said metal is progressively deposited in the continuous layer on said surface region; and (e) means for controlling the position of said lens means in said path so as to maintain said incident beam to be always focused on the instantaneous localized area in said region against a changing thickness of said flowing solution traversed by said incident beam.

29. An apparatus for chemically depositing a metal on a workpiece, comprising:

(a) means for supplying a liquid solution containing the metal in a flow in contact with the workpiece;

(b) means for directing a narrow thermal energy beam from a source thereof through said flowing solution of a varying thickness towards said workpiece to cause the beam to be incident upon a localized area of the workpiece, thereby activating an interface between said flowing solution and said area to allow the metal to be electrodeposited therefrom selectively onto said area, said directing means including lens means disposed in a path of said beam between said source and said workpiece and out of contact with said flowing solution;

(c) drive means for automatically displacing said source and said workpiece generally translationally in a predetermined scanning manner such as to shift said localized beam incidence successively over a desired surface region on the workpiece whereby said metal is sequentially deposited on said surface region; and (d) means for controlling the position of said lens means in said path so as to maintain said incident beam to be always focused on the instantaneous localized area in said region against said varying thickness of said flowing solution traversed by said incident beam.

30. An apparatus for chemically depositing a metal on a workpiece, comprising:

(a) means for supplying a liquid solution containing the metal in a flow in contact with the workpiece;

(b) means for directing a narrow thermal energy beam from a source thereof through said flowing solution of a varying thickness towards said workpiece to cause the beam to be incident upon a localized area of the workpiece, thereby activating an interface between said flowing solution and said area to allow the metal to be electrodeposited therefrom selectively onto said area;

(c) drive means for automatically displacing said directing means and said workpiece in a predetermined scanning manner such as to shift said localized beam incidence successively over a desired surface region on the workpiece whereby said metal is sequentially deposited on said surface region; and (d) means for controlling at least one of the parameters: the rate of relative displacement between said directing means and said workpiece and the energy of said beam at said source, as a function of said varying thickness of said flowing solution in said path of the beam.

31. An apparatus for chemically depositing a metal onto a workpiece, comprising:

(a) means for bringing a liquid solution containing the metal into contact with said workpiece;

(b) means for directing a narrow thermal light beam onto said workpiece to cause said beam to be incident upon a localized area thereon, thereby activating an interface between said area and said solution to allow said metal to be chemically deposited therefrom selectively onto said area, said means (b) comprising a unitary assembly including a source of said beam and an elongate solid optical guide member having its one end connected to said source and its other end disposed in said solution for projecting said beam transmitted via said elongate optical guide member from said source onto said localized area;

(c) means for automatically displacing said unitary assembly and said workpiece to shift said localized beam incidence successively over a predetermined surface region of said workpiece whereby said metal is sequentially deposited on said surface region; and (d) means for maintaining said other end of the elongate solid optical guide member closely spaced from said localized area as said beam and said workpiece are relatively displaced by said means (c).

32. An apparatus for chemically depositing a metal onto a workpiece, comprising:

(a) means for supplying a liquid solution containing the metal in a flow in contact with the substrate;

(b) means for directing a narrow thermal light beam onto said workpiece to cause said beam to be incident upon a localized area thereon, thereby activating an interface between said area and said flowing solution to allow said metal to be chemically deposited therefrom selectively onto said area, said means (b) comprising a unitary assembly including a source of said beam and a hollow, elongate optical guide member having its one end connected to said source and its other end disposed in said flowing solution and which is open to and adapted to be closely spaced, from said localized area for projecting said beam transmitted from said source onto said area; and (c) means for automatically displacing said unitary assembly and said workpiece to shift said localized beam incidence from said hollow, elongated solid optical guide member successively over a predetermined surface region of said workpiece whereby said metal is sequentially deposited onto said surface region.

33. The apparatus defined in claim 25, claim 26, claim 27, claim 28, claim 29 or claim 30 wherein said means (b) includes a laser emitting said energy beam.

34. The apparatus defined in claim 33 wherein said laser is an argon gas laser.

35. The apparatus defined in claim 33 wherein said laser is a carbon-dioxide gas laser.

36. The apparatus defined in claim 25, claim 26, claim 27, claim 28, claim 29 or claim 30 wherein said means (b) includes a xenon lamp constituting a source of said energy beam.

37. The apparatus defined in claim 31 wherein said unitary assembly comprises a plurality of such sources respectively coupled with such solid optical guide member for projecting a plurality of such light beams to be incident upon a plurality of such localized areas spaced from one another.

38. The apparatus defined in claim 32 wherein said other end of said hollow member is fitted with a transparent or semitransparent solid member for preventing introduction thereinto of said flowing solution.

39. The apparatus defined in claim 32 wherein said solid member comprises a lens for focusing said light beam from said source onto said localized area.

40. The apparatus defined in claim 32, further comprising means for filling the hollow space in said hollow member with a pressurized gas to prevent introduction thereinto of said flowing solution.

* * * * *